(12) United States Patent
Lenchenkov et al.

(10) Patent No.: US 12,120,426 B2
(45) Date of Patent: Oct. 15, 2024

(54) COLOR CMOS IMAGE SENSOR WITH DIFFRACTIVE MICROLENSES OVER SUBPIXEL PHOTODIODE ARRAYS ADAPTED FOR AUTOFOCUS

(71) Applicant: OmniVision Technologies, Inc., Santa Clara, CA (US)

(72) Inventors: Victor Lenchenkov, Sunnyvale, CA (US); Andreas Suess, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 300 days.

(21) Appl. No.: 17/576,816

(22) Filed: Jan. 14, 2022

(65) Prior Publication Data

US 2022/0239840 A1    Jul. 28, 2022

Related U.S. Application Data

(60) Provisional application No. 63/140,600, filed on Jan. 22, 2021.

(51) Int. Cl.
  *H04N 23/67* (2023.01)
  *G02B 5/18* (2006.01)
  (Continued)

(52) U.S. Cl.
  CPC ......... *H04N 23/672* (2023.01); *G02B 5/1814* (2013.01); *G02B 5/201* (2013.01);
  (Continued)

(58) Field of Classification Search
  CPC ............................ H04N 23/672; H04N 25/11; H01L 27/14621; H01L 27/14627;
  (Continued)

(56) References Cited

U.S. PATENT DOCUMENTS 6,765,617 B1 * 7/2004 Tangen ................ H04N 25/611
  348/340
7,684,126 B2 * 3/2010 Eckhardt ................ G01J 1/0411
  359/742

(Continued)

OTHER PUBLICATIONS

Koifman et al., "Fujifilm Develops Multispectral Camera Based on Polarization-Sensing CIS", Image Sensors World, http://image-sensors-world.blogspot.com/2020/07/fujifilm-develops-multispectral-camera.html, Jul. 14, 2020, 10 pages.

(Continued)

*Primary Examiner* — Twyler L Haskins
*Assistant Examiner* — John H Morehead, III
(74) *Attorney, Agent, or Firm* — COZEN O'CONNOR (57) ABSTRACT

An image sensor has diffractive microlenses over pixels with central structures and ring(s) of material having index of refraction different from that of background material. Disposed beneath the diffractive microlenses are photodiodes that permit determining ratios of illumination of peripheral photodiodes to illumination of central photodiodes of the pixels, and, in embodiments, circuitry for determining said ratio. In embodiments, the ratio is used to find illumination wavelengths; and in other embodiments the ratio is used to determine focus of an imaging lens providing illumination. A method determines color by passing light through a diffractive lens disposed above photodiodes of the diffractive pixel and determining color from illumination peripheral and central photodiodes. An autofocus method of determining focus includes passing light through a diffractive lens and determining focus from illumination of peripheral photodiodes and central photodiodes of the pixel. In embodiments, the central structures are disks and rings are round.

21 Claims, 10 Drawing Sheets

(51) Int. Cl.
  *G02B 5/20* (2006.01)
  *G02B 7/28* (2021.01)
  *H01L 27/146* (2006.01)
  *H04N 25/11* (2023.01)

(52) U.S. Cl.
  CPC .......... *G02B 7/28* (2013.01); *H01L 27/14621* (2013.01); *H01L 27/14627* (2013.01); *H01L 27/14645* (2013.01); *H04N 25/11* (2023.01)

(58) Field of Classification Search
  CPC . H01L 27/14645; G02B 5/1814; G02B 5/201; G02B 7/28; G02B 3/08; G02B 5/1876; G02B 7/34
  See application file for complete search history.

(56) References Cited

U.S. PATENT DOCUMENTS

| | | | | |
|---|---|---|---|---|
| 2005/0117223 | A1* | 6/2005 | Bi | G02B 5/1876 359/578 |
| 2008/0023624 | A1* | 1/2008 | Moon | H01L 27/14625 257/E31.127 |
| 2008/0094716 | A1* | 4/2008 | Ushiro | G02B 3/0018 359/620 |
| 2008/0291445 | A1* | 11/2008 | Iwane | G01J 3/1804 356/328 |
| 2009/0115011 | A1* | 5/2009 | Ushiro | H01L 27/14621 257/E31.127 |
| 2010/0091168 | A1* | 4/2010 | Igarashi | G03B 17/00 257/E31.127 |
| 2010/0188532 | A1* | 7/2010 | Kusaka | H04N 25/704 348/240.99 |
| 2011/0037883 | A1* | 2/2011 | Lee | H04N 25/134 348/E9.01 |
| 2013/0270665 | A1* | 10/2013 | Sasaki | H01L 31/02325 257/432 |
| 2018/0184013 | A1* | 6/2018 | Hamano | H04N 23/672 |
| 2019/0081098 | A1* | 3/2019 | Lenchenkov | H04N 25/75 |
| 2019/0364220 | A1* | 11/2019 | Fukuda | G02B 7/34 |
| 2021/0266431 | A1* | 8/2021 | Lenchenkov | H04N 23/55 |
| 2021/0280624 | A1* | 9/2021 | Lenchenkov | H01L 27/14685 |
| 2023/0123763 | A1* | 4/2023 | Lenchenkov | G02B 5/3058 348/222.1 |

OTHER PUBLICATIONS

Maruyama et al., 3.2-MP Back-Illuminated Polarization Image Sensor With Four-Directional Air-Gap Wire Grid and 2.5-μm Pixels, IEEE Transactions on Electron Devices, vol. 65, No. 6, Jun. 2018, pp. 2544-2551.

* cited by examiner

COLOR CMOS IMAGE SENSOR WITH DIFFRACTIVE MICROLENSES OVER SUBPIXEL PHOTODIODE ARRAYS ADAPTED FOR AUTOFOCUS

RELATED APPLICATIONS

This application claims the benefit of priority of U.S. Provisional Patent Application No. 63/140,600, filed Jan. 22, 2021, the entire content of which is incorporated herein by reference.

FIELD

The present application relates to the field of non-Bayer-pattern, color, high-quantum-efficiency, CMOS image sensors.

BACKGROUND

High quantum efficiency (QE) image sensors can provide available-light imaging at night in poorly lit areas for security cameras and automotive applications.

Traditionally, CMOS color image sensors have used an array of absorptive color filters of 3 or more colors arranged in a tiling pattern over a photodiode array formed in a semiconductor. In many image sensors these color filters are arranged in a "Bayer pattern" of three colors (usually red, green, and blue pass filters), or of three colors plus clear, over tiling units of four photodiodes such that one, or in some systems one for some colors and two for others, are exposed to light of each color. Color information for a pixel is then determined by ratioing of light received by differently-filtered photodiodes of the pixel.

Since the color filters of traditional Bayer-pattern image sensors are absorptive, less than a third of photons arriving at each pattern pass through the filters to reach the photodiodes, causing the system to have low quantum efficiency. Further, extending Bayer-pattern image sensors into the infrared, or providing high quantum efficiency for nighttime imaging, requires using larger tiling patterns requiring 6, 9, or more photodiodes per pixel.

Traditional Bayer-pattern image sensors can produce false colors at high-contrast, sharply focused, image boundaries because filters and photodiodes of the pixel are not uniformly illuminated. Further, traditional Bayer-pattern image sensors have filters that absorb some of the photons that strike the sensor, thereby reducing overall sensitivity of the image sensor.

Many modern cameras have an autofocus system.

Some active autofocus systems operate by shifting a position of a lens to until contrast between pixels along a row of pixels is enhanced.

Phase detection (PD) autofocus systems typically operate by dividing a portion of the incoming light into pairs of images and comparing them. Through-the-lens secondary image registration passive phase detection uses a beam splitter (implemented as a small semi-transparent area of the main reflex mirror, coupled with a small secondary mirror) to direct light to an autofocus sensor separate from the camera's primary image sensor. Two small lenses capture the light rays coming from opposite sides of the lens and divert it to the autofocus sensor, creating a simple split-image rangefinder with a base within the lens's diameter. The two images are then analyzed for similar light intensity patterns (peaks and valleys) and the disparity between the images is calculated in order to find whether the object is in front focus or back focus position. This gives the direction and an estimate of the required amount of focus-ring movement.

SUMMARY

In embodiments, to provide an image sensor with high quantum efficiency, an image sensor uses diffractive microlenses at each pixel to spatially separate photons according to wavelength onto photodiodes of the pixel, giving a wavelength or color-dependent photodiode excitation pattern among the photodiodes of each pixel.

In embodiments, to perform autofocus based on single pixels, one or more individual diffractive pixels of an image sensor array are read to determine diffraction patterns produced by diffractive microlenses at those pixels. The diffraction patterns are analyzed to determine focus at those pixels.

In embodiments, an image sensor has diffractive pixels with diffractive microlenses with central disks and concentric ring(s) of material having a coefficient of refraction different from that of background material. Disposed beneath the diffractive microlenses are photodiodes that permit determining ratios of illumination of peripheral photodiodes to illumination of central photodiodes of the pixels, and circuitry for determining said ratio. In embodiments, the ratio is used to find illumination wavelengths; and in other embodiments the ratio is used to determine focus of an imaging lens providing illumination.

In an embodiment, a method determines color by passing light through a diffractive lens disposed above photodiodes of the diffractive pixel and determining color from illumination peripheral and central photodiodes.

In an embodiment, an autofocus method of determining focus includes passing light through a diffractive lens and determining focus from illumination of peripheral photodiodes and central photodiodes of the pixel.

DETAILED DESCRIPTION OF THE EMBODIMENTS

Color Recognition with High Quantum Efficiency

In order to provide an image sensor with high quantum efficiency, an image sensor uses diffractive microlenses at each of multiple pixels to spatially separate photons according to wavelength onto photodiodes of the pixel, giving a wavelength, or color, dependent photodiode excitation pattern among the photodiodes of each pixel. The photodiodes are formed in a semiconductor, which is silicon in many embodiments. The photodiodes are typically configured for backside illumination. In an exemplary embodiment, the pixels are arranged in a rectangular array of 4000 by 2000 pixels (8 megapixels), each pixel having from 5 to 9 photodiodes, including from 40 to 72 million photodiodes. Lower and higher resolution image sensor embodiments may be constructed with any combination of horizontal resolutions from 600 to 8000 pixels, and vertical resolutions from 480 to 8000 pixels. In alternative embodiments, pixels with diffractive microlenses as described herein are intermingled with conventional Bayer-pattern color-filtered pixels in a pattern to provide conventional color images with the diffractive-microlens pixels providing extended wavelength resolution deep into the near-infrared portions of the spectrum.

In an embodiment, for each pixel of the image sensor, a diffractive microlens has a central structure in form of a central disk 102 (FIG. 1, FIG. 2A, FIG. 2B, FIG. 3), an inner ring 104 concentric with, and spaced away from, central disk 102, and an outer ring 106 concentric with, and spaced away from, inner ring 104; this embodiment has a central disk and two concentric rings surrounding the central disk. Central disk 102, inner ring 104, and outer ring 106 are made of a same first transparent material approximately 200 nanometers thick having a higher refractive index than a second, background, second transparent background material 108 (FIG. 4) surrounding them, the background material and diffractive microlens being formed as a stack of less than 400 nanometers thickness disposed upon the backside of the semiconductor containing the photodiodes and are configured to provide illumination to photodiodes of the pixel. The semiconductor also has a frontside into which transistors are formed and on which interconnect metal and transistor gate materials are deposited. In alternative embodiments, the second or outer ring may be omitted, or there may be the second ring as described with a third ring (not shown) concentric with and external to each outer ring 106. In a particular embodiment, second transparent background material 108 is primarily silicon dioxide and first transparent material is silicon nitride; this structure avoids reflecting significant light arriving at the microlens while conductive metal would reflect light. The entire pixel, including photodiodes and microlens, as well as both inner and outer rings, has, in an embodiment, dimensions of 1.2 microns square with the inner and outer rings each having diameter of less than 1.2 microns. In an embodiment, total thickness of central disk 102, background material 108 underlying central disk 102 and transparent silicon nitride layer 402 (FIG. 4) is less than 400 nanometers. In a particular embodiment, the silicon nitride of central disk 102, inner ring 104, and outer ring 106, are covered with just enough silicon dioxide to act as an antireflective coating over the microlens and reduce reflection of light arriving on the image sensor.

Figure 1:
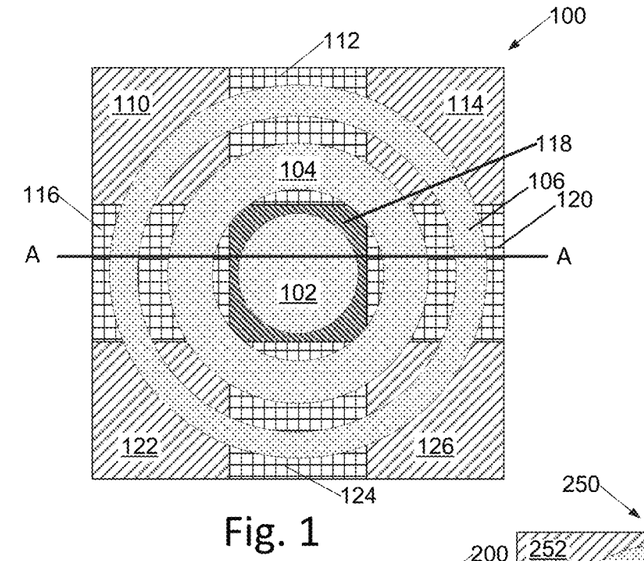
FIG. 1 is an exemplary top plan view of a diffractive lens over 9 photodiodes of a pixel of an image sensor, the image sensor having an array of these pixels.
Figure 2A:
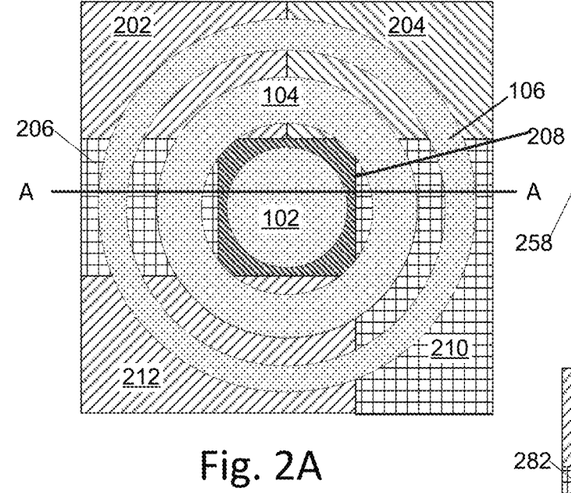
FIG. 2A is an exemplary top plan view of an alternative layout of a diffractive lens over 6 photodiodes of a pixel of an image sensor.
Figure 2B:
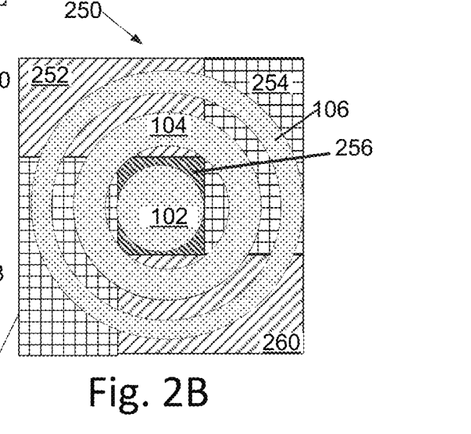
FIG. 2B is an exemplary top plan view of an alternative layout of a diffractive lens over 5 photodiodes of a pixel of an image sensor.
Figure 2C:
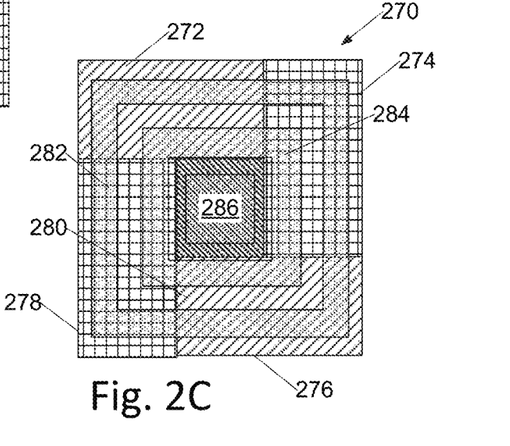
FIG. 2C is an exemplary top plan view of an alternative layout of a square diffractive lens over 5 photodiodes of a pixel of an image sensor.
Figure 3:
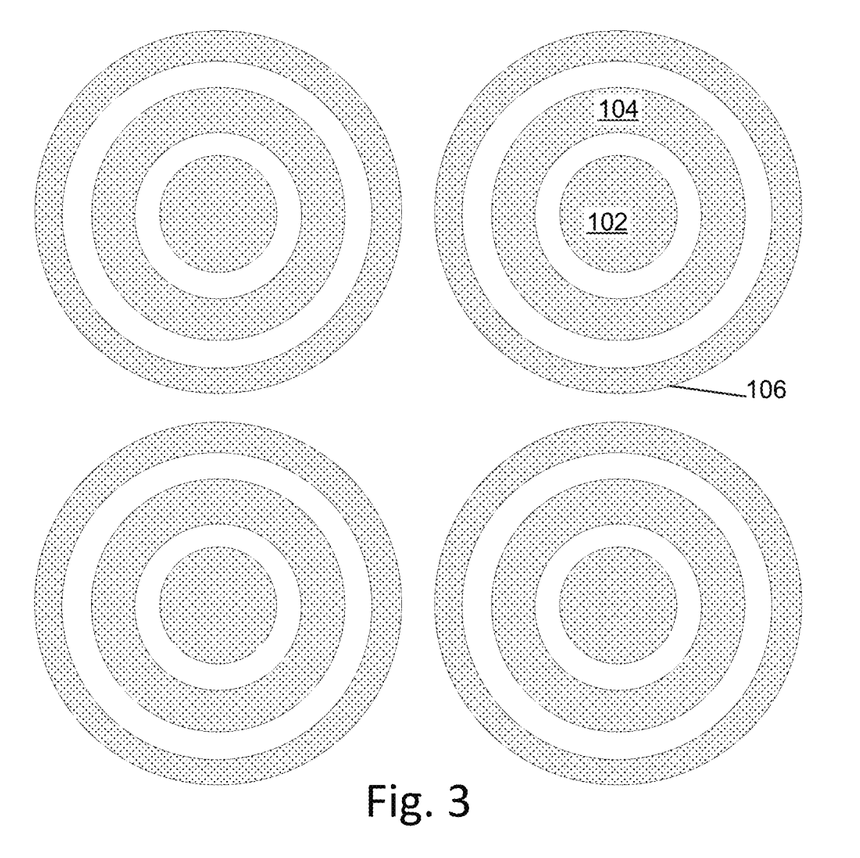
FIG. 3 is an exemplary top plan view of a group of diffractive lenses of a group of pixels as in the embodiments of FIG. 1, FIGS. 2A, and 2B.

In another alternative embodiment, FIG. 2C, the diffractive microlens has another shape. instead of a central disk surrounded by round rings as in the embodiments of FIGS. 1, 2A, 2B, and 3 with spacing and width configured to cause significant light convergence towards the central photodiode of a 5, 6, 7, or 9 photodiode pixel, the diffractive microlens has a square center structure surrounded by 1, 2 (illustrated), or 3 square or rectangular concentric rings with spacing and width configured to cause significant light convergence towards the central photodiode of a 5 (illustrated), 6, 7, or 9 photodiode pixel.

Light passing through the diffractive microlens is diffracted into underlying photodiodes of the pixel. In a nine-photodiode-per-diffractive-pixel embodiment 100 illustrated in FIG. 1, the nine photodiodes are designated upper-left (UL) 110, upper-center (UC) 112, upper right (UR) 114, center left (CL) 116, central (C) 118, center right (CR) 120, lower left (LL) 122, lower center (LC) (124) and lower right (LR) 126. In a six-photodiode alternative embodiment 200 illustrated in FIG. 2A, the six photodiodes are of nonuniform shapes and sizes, and are designated upper left (UL) 202, upper right (UR) 204, center left (CL) 206, Center (C) 208, Lower Right (LR) 210, and lower left (LL) 212. This six-photodiode embodiment preserves much data available with the nine-photodiode embodiment but costs fewer transistors. In yet another embodiment 250 adapted to preserve center versus periphery exposure data, see FIG. 2B, five photodiodes are provided designated upper left UL 252, upper right UR 254, center C 256, Lower Left LL 258, and Lower Right LR 260. A key to all of these photodiode arrangements is that they permit computation of at least one ratio of light received at peripheral photodiodes of the pixel to light received at a pixel center photodiode. The six and nine photodiode embodiments permit computation of a first ratio of light received at first peripheral photodiodes to light received at the central photodiode of the pixel, and a second ratio of light received at second peripheral photodiodes to light received at the central photodiode of the pixel, with the second peripheral photodiodes receiving light comprising light received more distal to the central photodiode than the first peripheral photodiodes.

While FIGS. 1, 2A and 2B show nine, five, and six photodiodes lying under each pixel's diffractive microlens explicitly, layouts with seven and eight photodiodes lying under each diffractive microlens are possible and can also function by permitting measurement of peripheral to central photodiode illumination.

Figure 4:
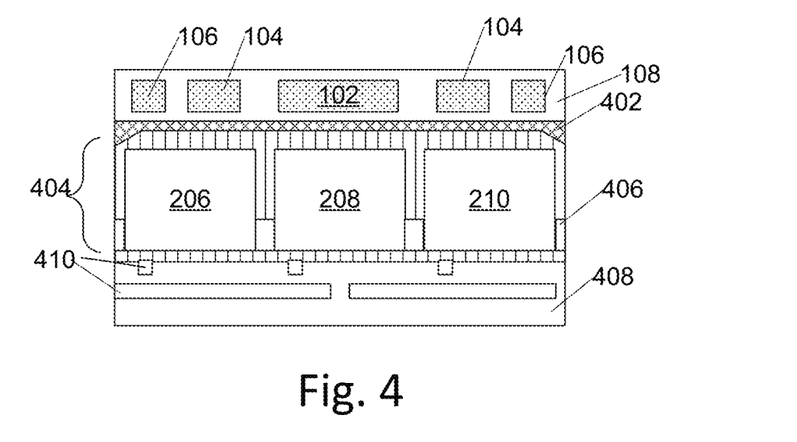
FIG. 4 is an exemplary cross-sectional diagram of a pixel of an image sensor along the line A-A in FIG. 1 or FIG. 2A.

In cross section, FIG. 4, the diffractive lens central disk 102 and inner 104 and outer rings 106 of first transparent material are surrounded by second transparent background material 108 and lie above a transparent silicon nitride layer 402. Beneath the silicon nitride layer is silicon substrate 404, approximately 3 microns thick, of a backside-illuminated photodiode array of the image sensor containing along line AA, center left CL 206, central photodiode 208, and lower right LR 210 photodiodes which may be isolated in whole or part by oxide-filled trenches 406. Beneath the photodiodes lies a frontside of the image sensor with dielectric 408 surrounding metal interconnect lines 410 and silicided polysilicon gate lines (not shown) and covered with passivation material (not shown).

The image sensor 500 has an image sensing array 502 of the pixels described in FIGS. 1, 2A, 2B, 2C, 3, and 4, the image sensing array 502 is surrounded by row decoders 504, column decoders and sense amplifiers 506, and ADC and serializer 508. Digitized data from the nine or six photodiodes of each pixel are fed through a diffraction pattern to red-green-blue (RGB) color translator 510 and focus detector 512 and then sent as RGB color and intensity information to image processor 514 organized as pixels and rows.

Figure 5:
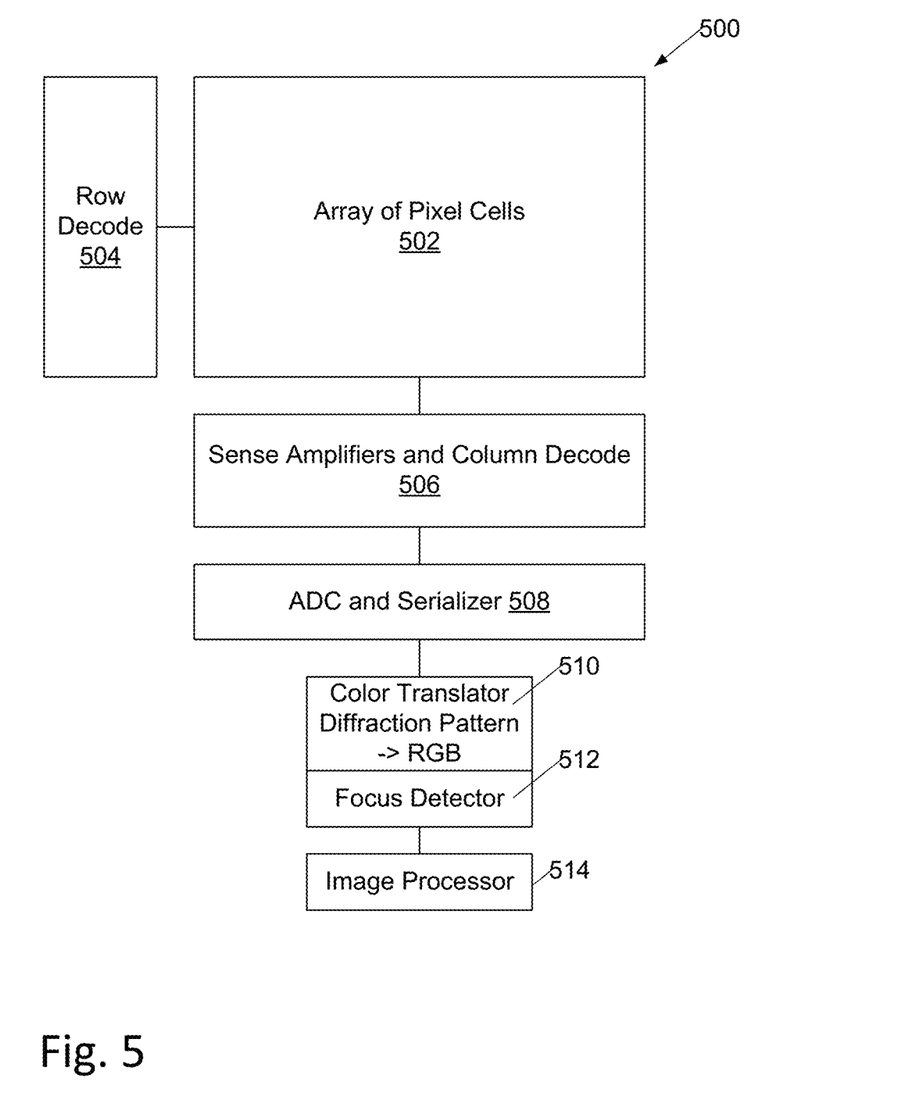
FIG. 5 is an exemplary block diagram of an image sensor using the pixels of FIGS. 1, 2A, 2B, and 2C.

In alternative embodiments, the image sensing array 502 is on a first integrated circuit in a system, with color translator 510, focus detector 512, and image processor 514 located on a second integrated circuit of the system. In another alternative embodiment, color translator 510 and focus detector 512 are implemented by software within image processor 514.

Image sensor 500, 602 may be used in a fixed-focus camera, but is typically used in an auto-focus camera 600 (FIG. 6) where a lens displacement motor 604 is adapted to shift imaging lens 606 in a tubular lens or camera body 608 under control of focus detector 512. A key issue with auto-focus cameras is to determine when an image of a scene is in focus, and if the image is not in focus, to determine whether to shift the lens towards, or away from, the associated film or image sensor to bring the image into focus.

Figure 7:
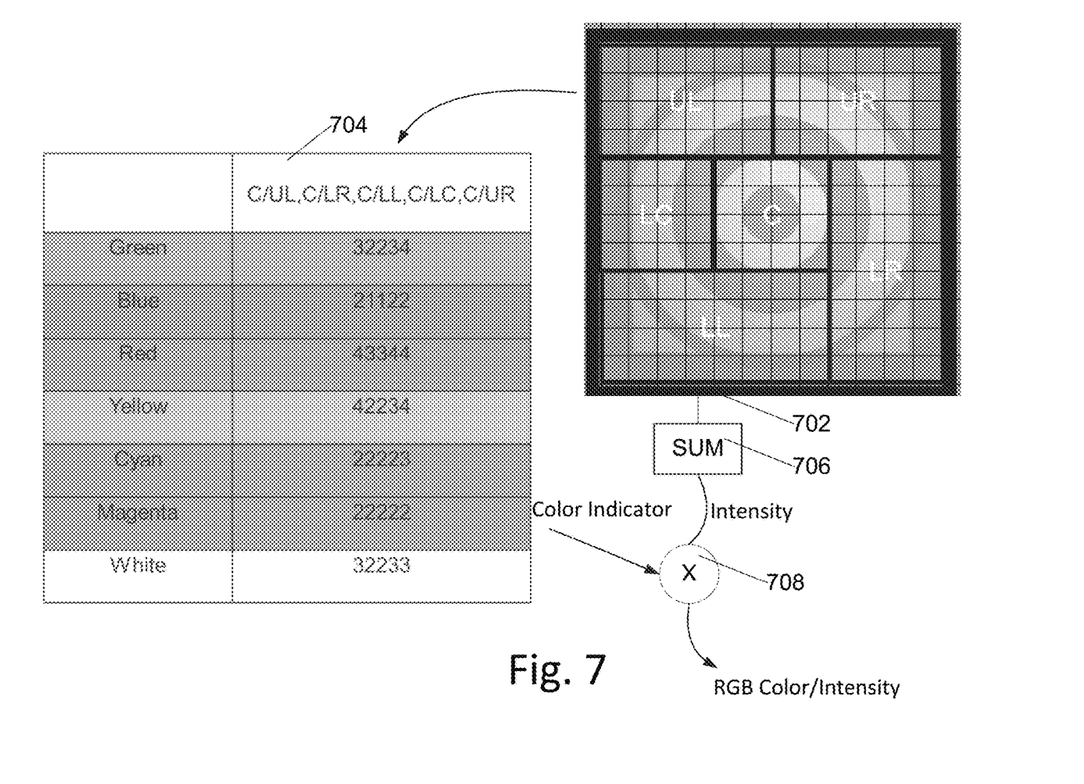
FIG. 7 illustrates a data flow of diffraction pattern to color translation using ratios of six photodiode readings.

The diffractive microlens provides a color-dependent non-uniformity of exposure across the six or nine photodiodes of each pixel. In a nine-photodiode embodiment, certain photodiode signals may be summed to correspond to photodiode signals available in a six-photodiode embodiment or these signals may be processed separately. The photodiode readings of nine-photodiode embodiments or of six-photodiode embodiment 702 represent color-dependent diffraction patterns and are processed to translate them to a red-green-blue representation of pixel color and intensity. In some embodiments, this translation is performed by ratioing the photodiode readings, with UL photodiode 202 reading divided by the center photodiode C 208 reading, upper right UR 204 photodiode reading divided by the central photodiode C 208 reading, center left (CL) 206 photodiode reading divided by the central photodiode 208 photodiode, lower right LR 210 photodiode reading divided by the central photodiode 208 reading, and lower left LL 212 photodiode reading divided by the central photodiode 208 reading and rounded to give a distinct color indicator as per table 704, the color indicator including a red, green, and blue factor for each color. The color indicator and an overall intensity determined as a sum 706 of all photodiode readings of the pixel can then be multiplied 708 to provide a red-green-blue color signal. In alternative embodiments, alternative numeric processing is performed to provide similar color recognition and translation from color-dependent diffraction patterns to red-green-blue, cyan-magenta-yellow-black, or other color and intensity signals common in the electronic camera art.

Figure 8:
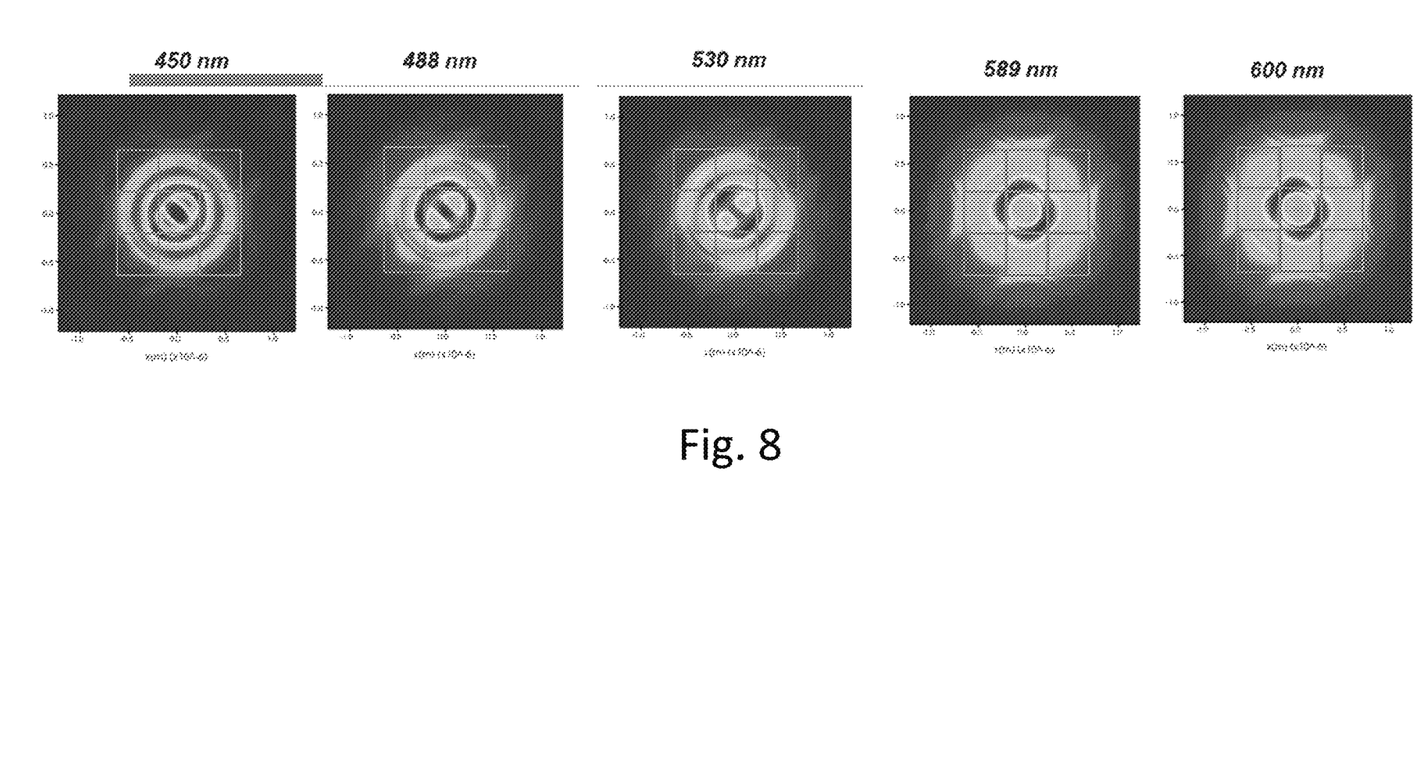
FIG. 8 illustrates exposure patterns as received by photodiodes of the pixels when pixels are illuminated with various colors of visible light.
Figure 9:
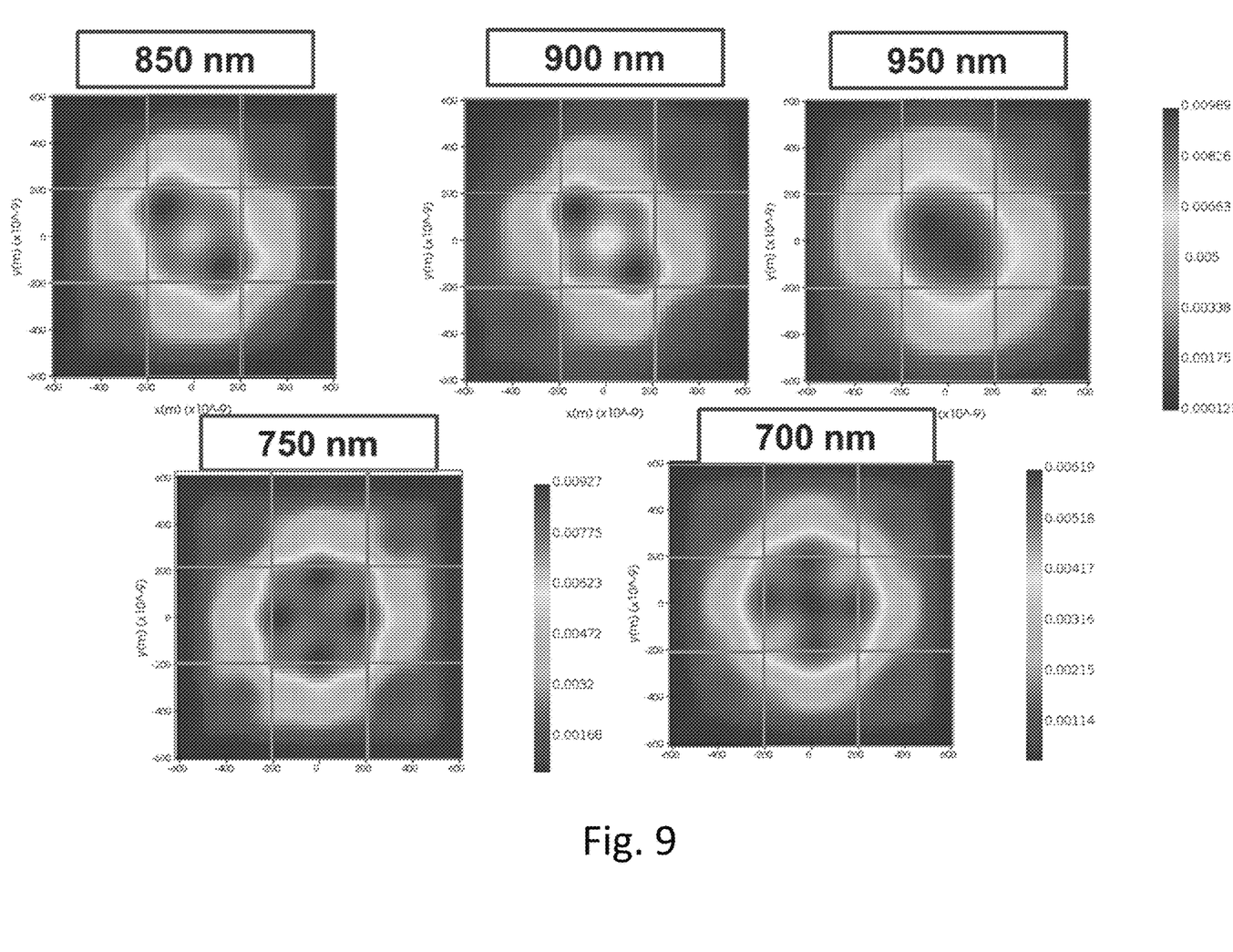
FIG. 9 illustrates exposure patterns as received by photodiodes of the pixels when pixels are illuminated with various colors of infrared light.

The pixels of the present design can respond to, and recognize, a broad range of wavelengths of light as illustrated by the diffraction patterns obtained at different wavelengths of light illustrated in FIGS. 8 and 9.

Autofocus with Diffractive Microlenses on 6-Photodiode Pixels

Figure 6:
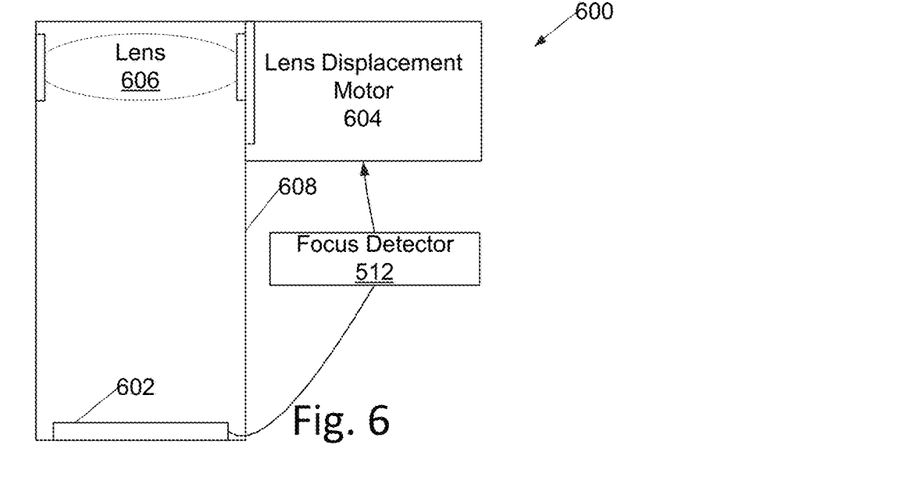
FIG. 6 is a cross sectional diagram of a camera incorporating an image sensor using the embodiments of FIG. 1, FIG. 2A, FIG. 2B, or FIG. 2C.
Figure 10A:
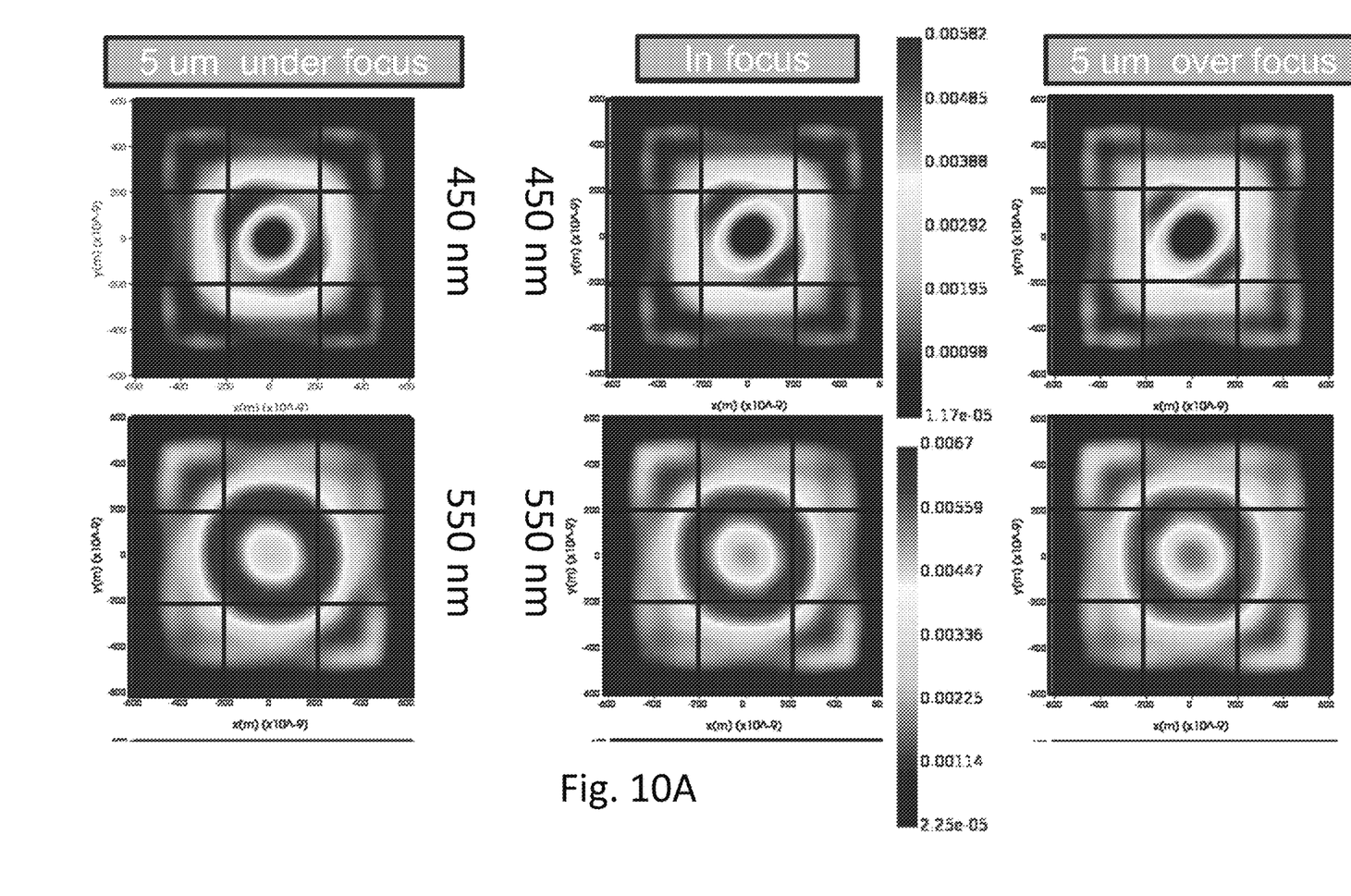
FIG. 10A illustrates illumination intensity on photodiodes of 9-subpixel pixels when they are illuminated with 450 nanometer wavelength blue light and 550 nanometer wavelength green visible light when images are under focus, in focus, and over focus.
Figure 10B:
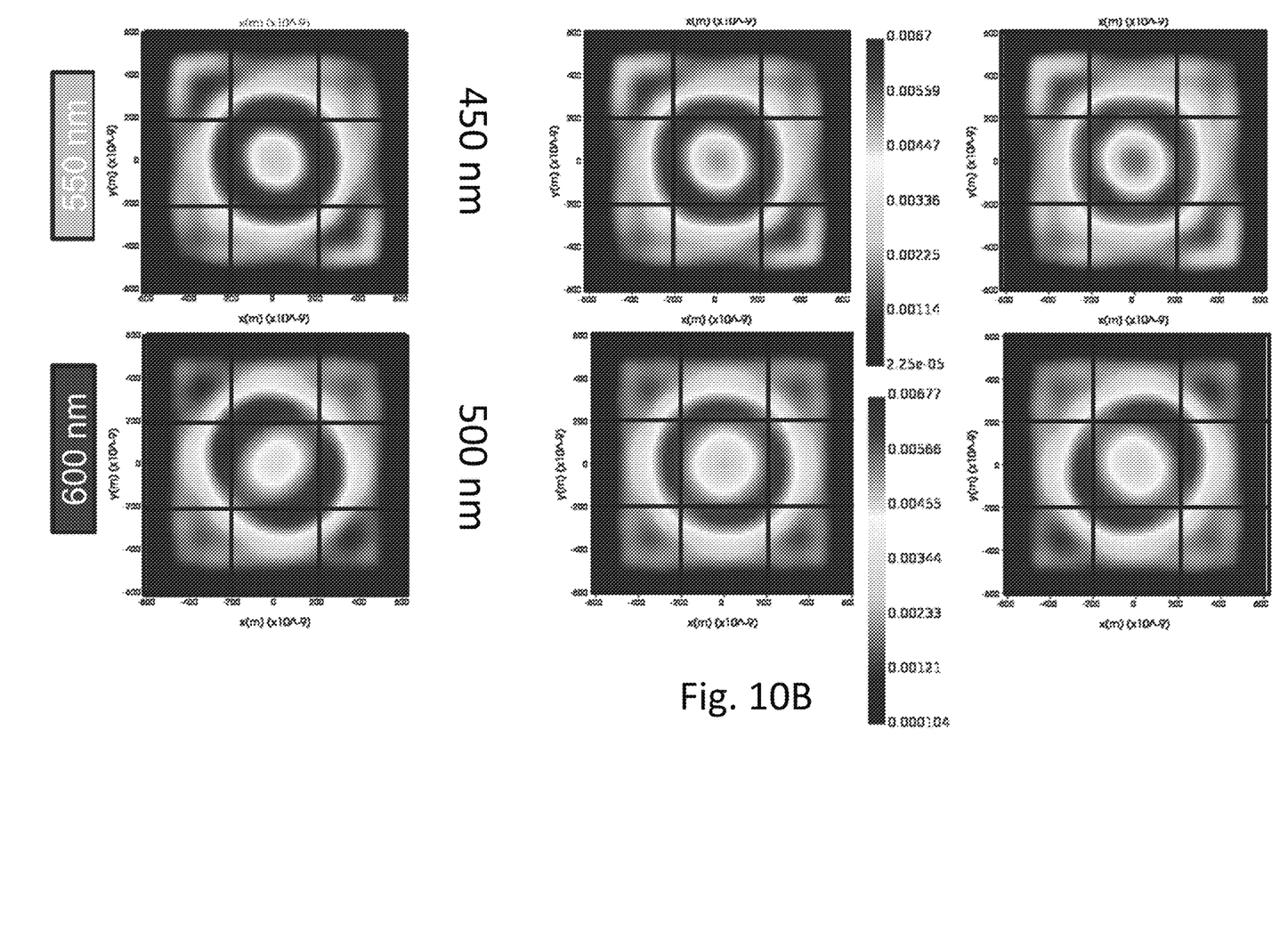
FIG. 10B illustrates illumination intensity on photodiodes of 9-subpixel pixels when they are illuminated with 550 nanometer green light and 600 nanometer red visible light when images are under focus, in focus, and over focus.

It has been found that diffraction patterns within the pixels are dependent on focus of imaging lens 606 on image sensor 602, in addition to being dependent on wavelength (or color) of light, as illustrated in FIGS. 10A and 10B. Comparison of ratios of sub-pixel photodiode readings between center and peripheral photodiodes therefore allow identification of an in-focus state at an individual pixel, together with identification of a direction of required lens movement to focus out-of-focus images, indicating whether the lens has to be moved towards the image sensor for the best focus (over focus state) or away from the image sensor (under focus state). In a particular embodiment, the ratios of subpixel photodiode readings allow a quantitative determination of how far the lens should be moved to bring images into focus.

Identification of which lens movement direction, with this technique, eliminates need to move the imaging lens in both directions while seeking for a lens position with sharpest intensity transitions in a scene, or need for an image processor to align portions of an image to determine an appropriate direction for lens movement as in phase-focus systems, thereby speeding autofocus focusing and permitting rapid tracking of focus as imaged objects move.

In an embodiment, the ratios of illumination of the peripheral photodiode, such as photodiodes 112, 114, 206, 210, 254, 258, to illumination of the central photodiode 256, 208, 118 are processed to determine whether the imaging lens 606 is properly focusing a scene on image sensor 602.

In a particular embodiment, the ratios of illumination of the peripheral photodiode, such as photodiodes 112, 114, 206, 210, 254, 258, to illumination of the central photodiode 256, 208, 118 are processed to provide an estimate of how far the lens should be moved to bring images into focus. In a particular embodiment, the system may then use a multi-speed lens movement system where, if a lens must be moved a great distance, the lens is moved initially at a high speed, then at a slow speed as focus is approached to avoid overshoot in lens movements while moving the lens to focus in less time than with conventional systems. In this particular embodiment, focus detector 512 is coupled to control lens displacement motor 604

Figure 11:
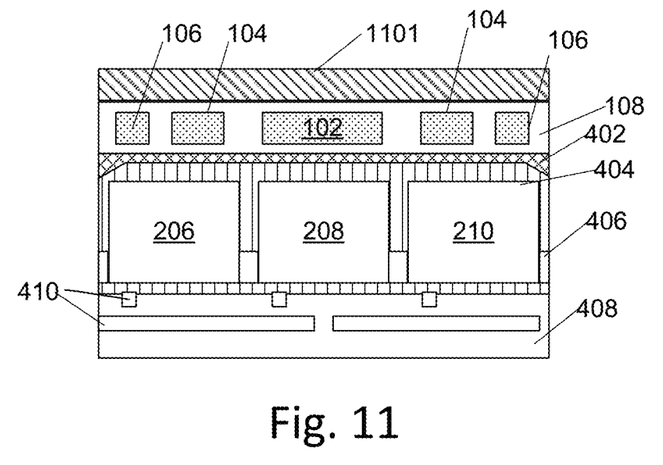
FIG. 11 illustrates a cross section of an autofocus implementation of the diffractive pixels with an optical bandpass filter to reduce wavelength dependency of diffraction patterns, permitting isolated autofocus operation.

Since the diffraction patterns are also wavelength dependent, in some autofocus embodiments a bandpass optical filter 1101 (FIG. 11) is disposed over the pixel to eliminate wavelength dependency of the diffraction patterns. This permits calibrated autofocusing with very high accuracy using responses from single pixels that may be positioned at particular autofocus points on an image sensor array.

Combined Wavelength Extraction and Autofocus Image Sensors

Figure 12A:
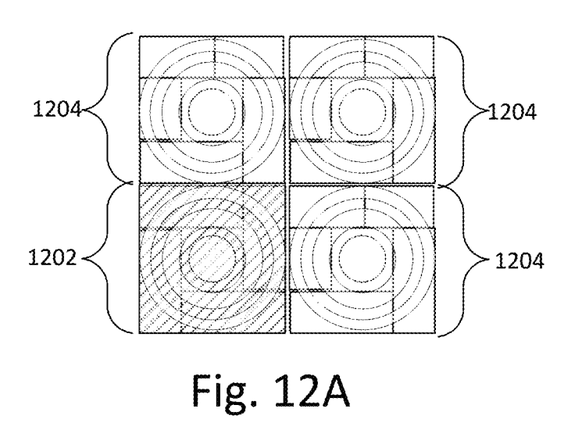
FIG. 12A illustrates a layout of pixels for focus detection and wavelength extraction for an infrared image sensor having diffractive pixels and at least one bandpass-filtered pixel for autofocus.

One or more diffractive pixels 1202 equipped with bandpass filters for focus detection and lens movement direction determination may be combined with diffractive pixels 1204 used for wavelength extraction in an image sensor, in an alternative embodiment, as illustrated in FIG. 12A. Since such image sensors can provide a ratio of peripheral to central photodiode illumination varying with wavelength in visible spectra as well as across the entire wavelength range from 600 to 900 nanometers, including near-infrared wavelengths, such image sensors may be useful to map temperature of objects based upon wavelength of infrared emissions because infrared emissions of objects have spectra that differ with temperature.

Figure 12B:
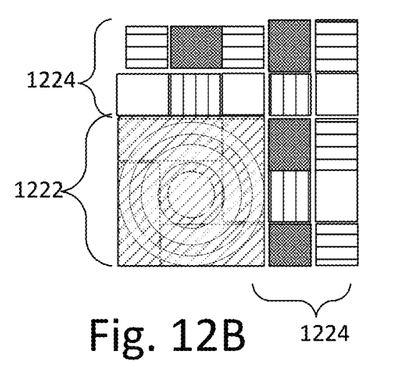
FIG. 12B illustrates a layout of pixels for an image sensor combining Bayer-pattern pixels with a bandpass-filtered diffractive pixel for autofocus.
Figure 13:
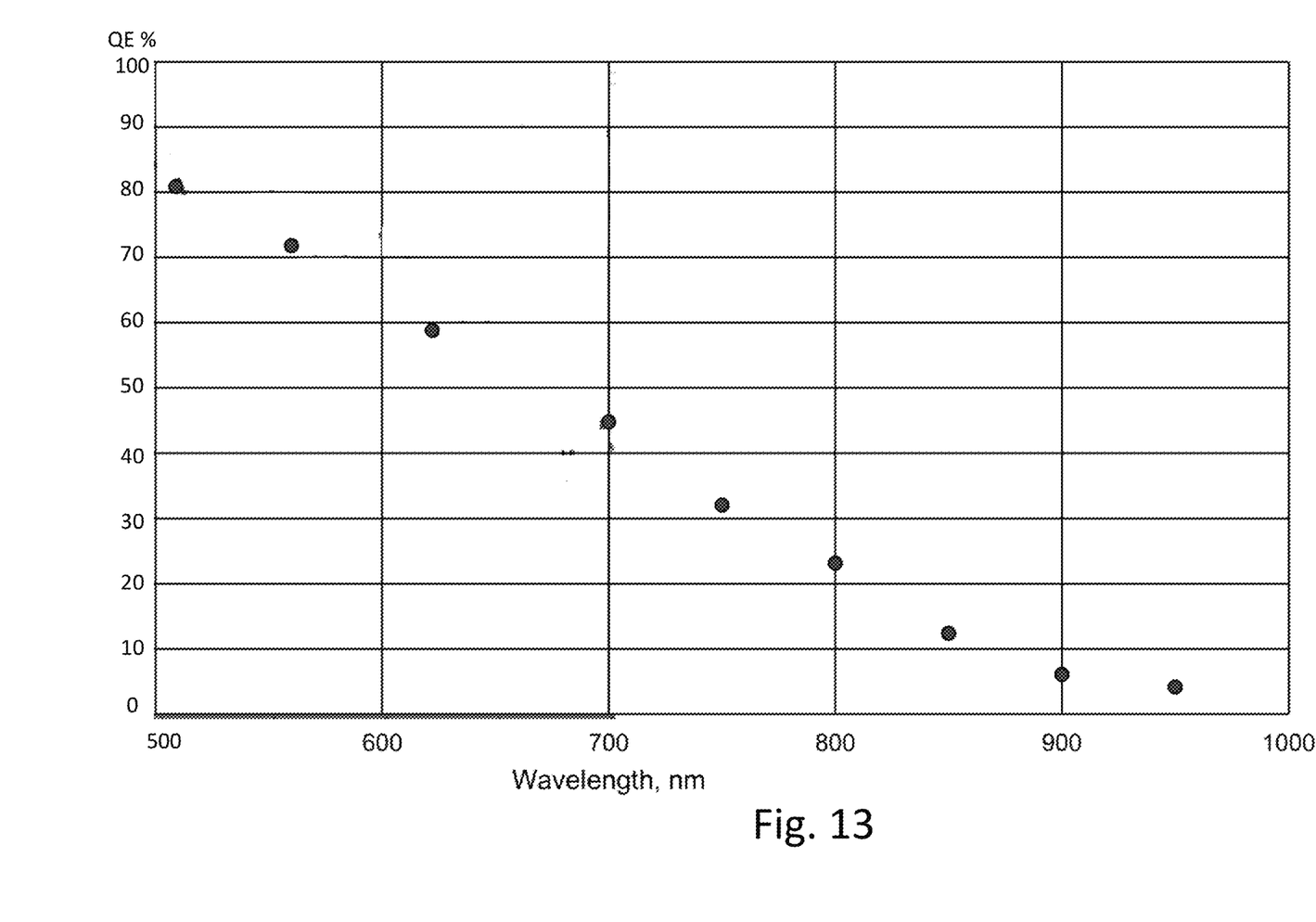
FIG. 13 illustrates function for autofocus or wavelength/color determination well into the infrared as well as at visible wavelengths.

One or more diffractive pixels 1222 (FIG. 12B) equipped with bandpass filters for focus detection and lens movement direction determination may be combined in another alternative embodiment with conventional 3-color-filter or 3-filter-plus-1-unfiltered four-or-more photodiode Bayer-pattern 1222, 1224 imaging pixels in an image sensor configured for traditional red-green-blue imaging. In this embodiment, color is determined by passing incoming light through three or more colors of optical bandpass filters, each color of optical bandpass filter being disposed over one or more photodiodes of four or more photodiodes of each Bayer-pattern pixel, while focus and required lens movement directions are determined from the diffractive pixel as heretofore described.

In other alternative embodiments, a camera may include a primary image sensor and a separate focus sensor including diffractive pixels as herein described. Such a camera would typically have either a beamsplitter or a movable mirror—as in single-lens reflex cameras—so light is admitted to the focus sensor during autofocus operation, while admitting light to the primary image sensor during imaging operations.

Combinations of Features

The disclosed embodiments can be combined in a variety of ways. Among combinations anticipated by the inventors are:

An image sensor designated A including multiple diffractive pixels, each diffractive pixel having a diffractive microlens with a central structure and at least one ring concentric with the central structure, the central structure and ring embedded in a background material having a first index of refraction, the central structure and the at least one ring formed of a transparent material having a second index of refraction different from the first index of refraction. There are multiple photodiodes beneath the diffractive microlens, the photodiodes configured to permit determining a ratio of illumination of at least one peripheral photodiode to illumination of a central photodiode; and circuitry configured to determine a ratio of illumination the at least one peripheral photodiode to illumination of the central photodiode.

An image sensor designated AA comprising the image sensor designated A wherein the central structure is a disk and the at least one ring concentric with the central structure comprises a first circular ring and an second circular ring.

An image sensor designated AAA comprising the image sensor designated AA where a diameter of the first ring and a diameter of the second ring is less than 1.2 micrometers.

An image sensor designated AB comprising the image sensor designated A, AAA or AA wherein the diffractive pixels each have 5, 6, or 9 photodiodes.

An image sensor designated AC comprising the image sensor designated A, AB, or AA including circuitry configured determine a second ratio of illumination of the central photodiode to illumination of at least one peripheral photodiode.

An image sensor designated AD comprising the image sensor designated A, AB, AC, or AA further comprising circuitry to determine a wavelength of illumination from the ratio of illumination of the central photodiode to the illumination of the at least one peripheral photodiode.

An image sensor designated AE comprising the image sensor designated A, AB, AC, AD, or AA further comprising circuitry to determine a focus of an imaging lens from a ratio of illumination of at least one peripheral photodiode of at least one diffractive pixel designated an autofocus diffractive pixel to illumination of a central photodiode of the at least one autofocus diffractive pixel.

An image sensor designated AF comprising the image sensor designated AE further comprising an optical bandpass filter disposed over photodiodes of the autofocus diffractive pixel.

An image sensor designated AG comprising the image sensor designated AE or AF further including circuitry configured to determine a direction of movement required to bring the imaging lens into correct focus at the pixel.

An autofocus camera designated AH comprising the image sensor designated AE, AF, or AG, plus an imaging lens and a lens displacement motor, the image sensor coupled to control the lens displacement motor, the image sensor further comprising a plurality of imaging pixels.

An image sensor designated AK comprising the image sensor designated A, AA, AB, AC, AD, AE, AF, AG, or AH wherein a stack of the background material and diffractive lens disposed on a backside of semiconductor containing the photodiodes is less than 400 nanometers in thickness.

A method designated B of determining a color of illumination light of a diffractive pixel includes passing illumination light through a diffractive lens of the diffractive pixel disposed above 5, 6, 7, 8, or 9 photodiodes of the diffractive pixel; and determining a color of illumination from illumination of at least one peripheral photodiode of the 5, 6, 7, 8, or 9 photodiodes and illumination of a central photodiode of the 5, 6, 7, 8, or 9 photodiodes.

A method designated BA comprising the method designated B wherein there are 5, 6, or 9 photodiodes in the diffractive pixel.

A method designated BB comprising the method designated B or BA wherein the determining a color of illumination is performed by a method comprising determining a ratio of illumination of the at least one peripheral photodiode of the pixel to illumination of a central photodiode of the pixel.

A method designated BC comprising the method designated B, BA, or BB wherein the diffractive lens comprises a central disk and at least one peripheral ring formed of a transparent material having a refractive index differing from a refractive index of a surrounding background material.

A method of determining focus for an autofocus system designated C, and optionally comprising the method designated B, BA, BB, or BC, includes passing illumination light through a diffractive lens of an autofocus diffractive pixel disposed above 5, 6, 7, 8, or 9 photodiodes of the autofocus diffractive pixel; and determining a focus of illumination from illumination of at least one peripheral photodiode of the 5, 6, 7, 8, or 9 photodiodes of the autofocus diffractive pixel and illumination of a central photodiode of the 5, 6, 7, 8, or 9 photodiodes of the autofocus diffractive pixel.

A method of determining focus for an autofocus system designated CA comprising the method designated C further includes passing the illumination light through an optical bandpass filter disposed above the 5, 6, 7, 8, or 9 photodiodes of the autofocus diffractive pixel.

A method of determining focus for an autofocus system designated CB comprising the method designated C or CA, where there are 5, 6, or 9 photodiodes in the autofocus diffractive pixel.

A method of determining focus for an autofocus system designated CC comprising the method designated C, CA, or CB wherein the illumination light is infrared.

A method of determining focus for an autofocus system designated CD comprising the method designated C, CA, or CB wherein the illumination light is visible.

A method designated CE of determining focus for an autofocus system comprising the method designated C, CA, CC, CD or CB further comprising determining colors of illumination light in each of a plurality of imaging pixels by passing incoming light through three or more optical bandpass filters of three or more colors, each of the three or more optical bandpass filters being disposed above a photodiode of four or more photodiodes of each imaging pixel Changes may be made in the above system, methods or device without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. An image sensor comprising:
   a plurality of diffractive pixels, each diffractive pixel comprising:
   a diffractive microlens comprising a central structure and at least one ring concentric with the central structure, the central structure and the at least one ring embedded in a background material having a first index of refraction, the central structure and the at least one ring formed of a transparent material having a second index of refraction different from the first index of refraction, and
   a plurality of photodiodes disposed beneath the diffractive microlens, the plurality of photodiodes configured to permit determining a ratio of illumination of at least one peripheral photodiode of the plurality of photodiodes to illumination of a central photodiode of the plurality of photodiodes;
   wherein a stack of the background material and diffractive lens disposed on a backside of semiconductor containing the plurality of photodiodes is less than 400 nanometers in thickness.

2. The image sensor of claim 1, wherein the at least one ring concentric with the central structure of the diffractive microlens of each diffractive pixel comprises at least a first and a second ring, the first and second ring being circular, and wherein the central structure is a disk.

3. The image sensor of claim 2, wherein the diffractive pixels each comprise 5, 6, or 9 photodiodes.

4. The image sensor of claim 3, further comprising circuitry configured to determine first ratio of illumination of first at least one peripheral photodiode to the central photodiode and to determine a second ratio of illumination of second at least one peripheral photodiode to illumination of the central photodiode, the first at least one peripheral photodiode different from the second at least one peripheral photodiode.

5. The image sensor of claim 3, further comprising circuitry to determine a wavelength of illumination from a ratio of illumination of the central photodiode to the illumination of the at least one peripheral photodiode.

6. The image sensor of claim 3, further comprising circuitry to determine a focus of an imaging lens from a ratio of illumination of at least one peripheral photodiode of at least one diffractive pixel designated an autofocus diffractive pixel to illumination of a central photodiode of the autofocus diffractive pixel.

7. The image sensor of claim 6, further comprising an optical bandpass filter disposed over photodiodes of the autofocus diffractive pixel.

8. The image sensor of claim 7, further comprising circuitry configured to determine a direction of movement required to bring the imaging lens into correct focus at the pixel.

9. An autofocus camera, comprising the image sensor of claim 8 comprising an imaging lens and a lens displacement motor, the image sensor coupled to control the lens displacement motor, the image sensor further comprising a plurality of imaging pixels.

10. An image sensor comprising:
    a plurality of diffractive pixels, each diffractive pixel comprising:
    a diffractive microlens comprising a central structure and at least one ring concentric with the central structure, the central structure and the at least one ring embedded in a background material having a first index of refraction, the central structure and the at least one ring formed of a transparent material having a second index of refraction different from the first index of refraction, and
    a plurality of photodiodes disposed beneath the diffractive microlens, the plurality of photodiodes configured to permit determining a ratio of illumination of at least one peripheral photodiode of the plurality of photodiodes to illumination of a central photodiode of the plurality of photodiodes;
    circuitry to determine a focus of an imaging lens from a ratio of illumination of at least one peripheral photodiode of at least one diffractive pixel designated an autofocus diffractive pixel to illumination of a central photodiode of the autofocus diffractive pixel; and
    an optical bandpass filter disposed over photodiodes of the autofocus diffractive pixel;
    wherein the at least one ring concentric with the central structure of the diffractive microlens of each diffractive pixel comprises at least a first and a second ring, the first and second ring being circular, and wherein the central structure is a disk;
    wherein the diffractive pixels each comprise 5, 6, or 9 photodiodes; and
    wherein a stack of the background material and diffractive lens disposed on a backside of semiconductor containing the plurality of photodiodes is less than 400 nanometers in thickness.

11. The image sensor of claim 1, further comprising circuitry configured to determine colors of illumination light in each of a plurality of diffractive pixels by passing incoming light through three or more optical bandpass filters of three or more colors, each of the three or more optical bandpass filters being disposed above a photodiode of four or more photodiodes of each diffractive pixel.

12. A method of determining a color of illumination light of a diffractive pixel, comprising:
    passing illumination light through a diffractive lens of the diffractive pixel disposed above 5, 6, 7, 8, or 9 photodiodes of the diffractive pixel; and
    determining a color of illumination from illumination of at least one peripheral photodiode of the 5, 6, 7, 8, or 9 photodiodes and illumination of a central photodiode of the 5, 6, 7, 8, or 9 photodiodes;

wherein a stack of a background material and the diffractive lens disposed on a backside of semiconductor containing the photodiodes is less than 400 nanometers in thickness.

13. The method of claim 12, wherein there are 5, 6, or 9 photodiodes in the diffractive pixel.

14. The method of claim 13, wherein the determining a color of illumination is performed by a method comprising determining a ratio of illumination of the at least one peripheral photodiode of the pixel to illumination of a central photodiode of the diffractive pixel.

15. The method of claim 13, wherein the diffractive lens comprises a central disk and at least one peripheral ring formed of a transparent material having a refractive index differing from a refractive index of a surrounding background material.

16. A method of determining focus for an autofocus system, comprising:
   passing illumination light through a diffractive lens of an autofocus diffractive pixel disposed above 5, 6, 7, 8, or 9 photodiodes of the autofocus diffractive pixel;
   determining a focus of illumination from illumination of at least one peripheral photodiode of the 5, 6, 7, 8, or 9 photodiodes and illumination of a central photodiode of the 5, 6, 7, 8, or 9 photodiodes; and
   wherein a stack of a background material and the diffractive lens disposed on a backside of semiconductor containing the photodiodes is less than 400 nanometers in thickness.

17. The method of claim 16, further comprising passing the illumination light through an optical bandpass filter disposed above the 5, 6, 7, 8, or 9 photodiodes of the autofocus diffractive pixel.

18. The method of claim 17, where there are 5, 6, or 9 photodiodes in the autofocus diffractive pixel.

19. The method of claim 18, further comprising determining a color of illumination light of an imaging diffractive pixel comprising:
   passing illumination light through a diffractive lens of the imaging diffractive pixel disposed above 5, 6, or 9 photodiodes of the imaging diffractive pixel; and
   determining a color of illumination from illumination of at least one peripheral photodiode of the 5, 6, or 9 photodiodes of the imaging diffractive pixel and illumination of a central photodiode of the 5, 6, or 9 photodiodes of the imaging diffractive pixel.

20. The method of claim 19, wherein the illumination light is infrared.

21. The method of claim 18, further comprising determining colors of illumination light in each of a plurality of imaging pixels by passing incoming light through three or more optical bandpass filters of three or more colors, each of the three or more optical bandpass filters being disposed above a photodiode of four or more photodiodes of each imaging pixel.

* * * * *